United States Patent [19]

Leidich

[11] 4,078,207
[45] Mar. 7, 1978

[54] PUSH-PULL TRANSISTOR AMPLIFIER WITH DRIVER CIRCUITRY PROVIDING OVER-CURRENT PROTECTION

[75] Inventor: Arthur John Leidich, Flemington, N.J.

[73] Assignee: RCA Corporation, New York, N.Y.

[21] Appl. No.: 757,555

[22] Filed: Jan. 7, 1977

[51] Int. Cl.[2] .............................................. H03F 3/26
[52] U.S. Cl. ................................ 330/273; 330/207 P; 330/272; 330/298
[58] Field of Search ....................... 330/15, 22, 207 P; 330/23

[56] References Cited

U.S. PATENT DOCUMENTS

| | | | |
|---|---|---|---|
| 3,855,540 | 12/1974 | Leidich | 330/15 X |
| 3,969,679 | 6/1976 | Sexton | 330/22 |

*Primary Examiner*—Lawrence J. Dahl
*Attorney, Agent, or Firm*—H. Christoffersen; A. L. Limberg

[57] ABSTRACT

A modified connection of elements in a push-pull transistor amplifier with driver circuitry providing over-current protection, which amplifier has previously been described by the present inventor in U.S. Pat. No. 3,855,540, increases the current gain through the push-pull transistor amplifier by a factor equal to the common-emitter forward current gain ($h_{fe}$) of a transistor.

5 Claims, 3 Drawing Figures

PUSH-PULL TRANSISTOR AMPLIFIER WITH DRIVER CIRCUITRY PROVIDING OVER-CURRENT PROTECTION

The present invention relates to improvements in push-pull amplifiers with driver circuits providing over-current protection as described in my U.S. Pat. No. 3,855,540 entitled "Push-Pull Transistor Amplifier With Driver Circuits Providing Over-Current Protection," issued Dec. 17, 1974, and assigned to RCA Corporation.

More particularly, the present invention resides in a modified connection of elements which increases the current gain through the push-pull transistor amplifier by a factor equal to the common-emitter forward current gain ($h_{fe}$) of a transistor--e.g., by a factor of 30 to 200 --without substantial compromise of other desirable characteristics of the amplifier.

Figure 1:
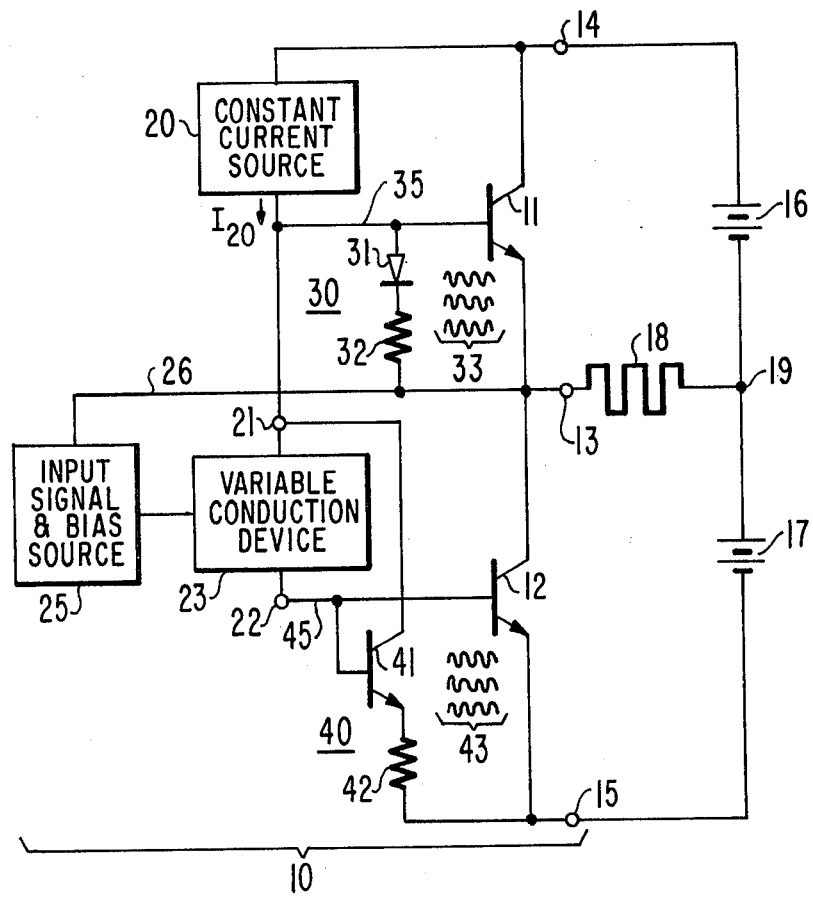
Figure 2:
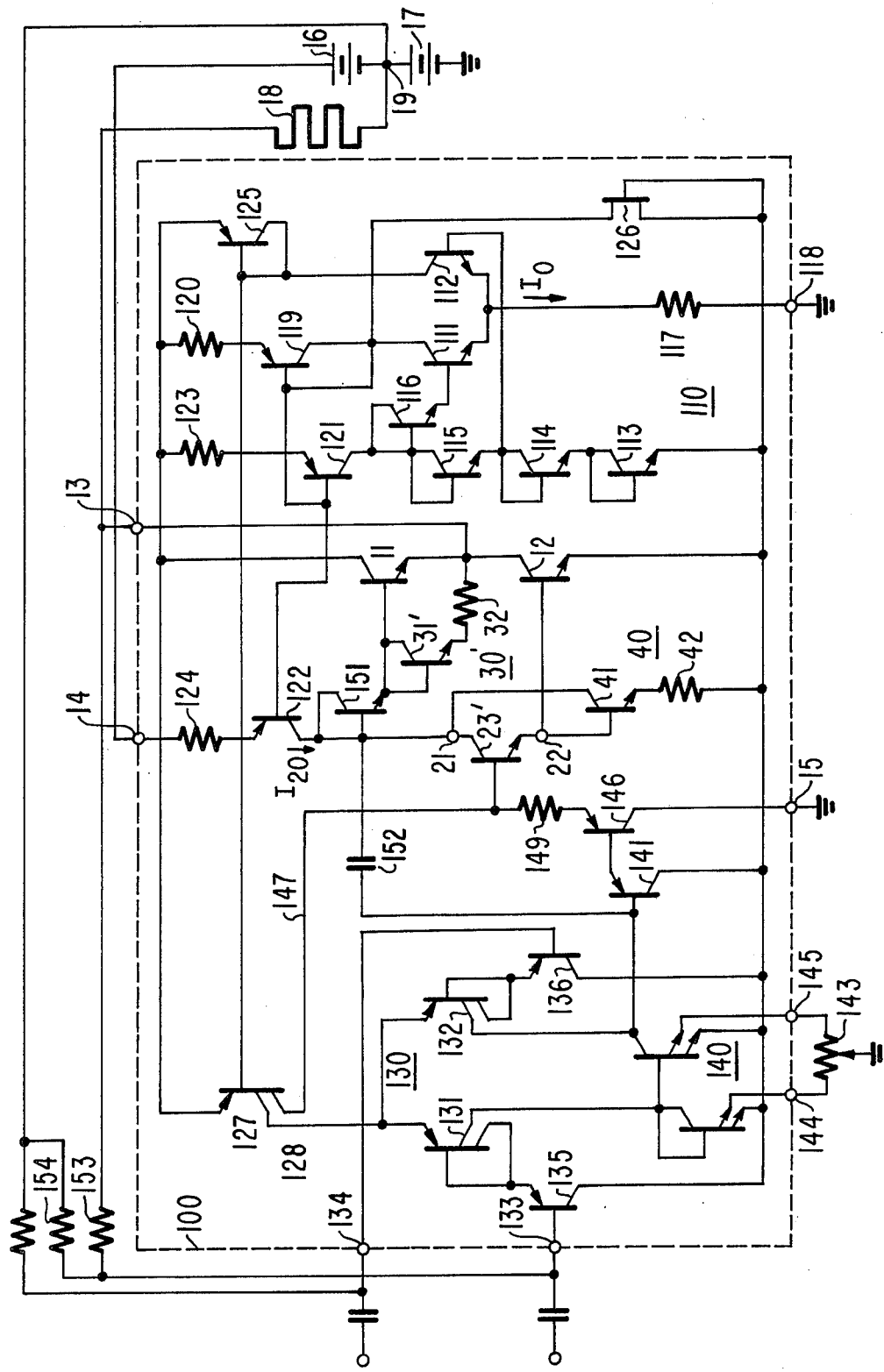
Figure 3:
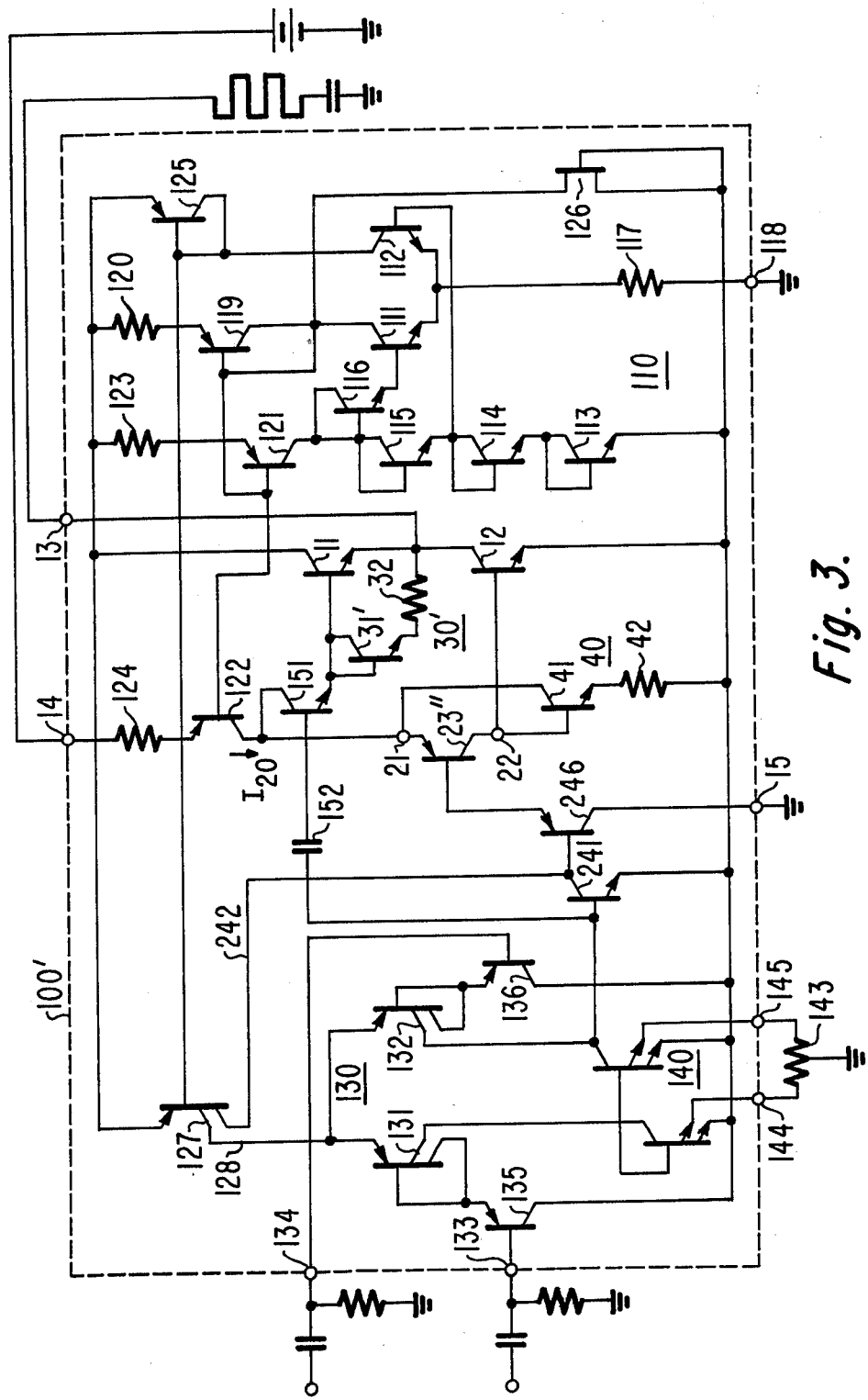

FIGS. 1, 2 and 3 are schematic diagrams of push-pull amplifiers with driver circuits providing over-current protection, each embodying the present invention.

FIG. 1 shows a basic amplifier configuration 10, with an output amplifying stage comprising transistors 11 and 12. The emitter electrode of transistor 11 and the collector electrode of transistor 12 are connected to a terminal 13 from which output signal is to be provided. Terminals 14 and 15, to which the collector electrode of transistor 11 and the emitter electrode of transistor 12 are respectively connected, are suitable for application of an operating voltage therebetween. Such operating voltage is supplied from the serially-connected operating power supplies 16 and 17. A load 18 for the amplifier may be direct coupled between output terminal 13 and an interconnection 19 between supplies 16 and 17, as shown. Alternatively, the load 18 may be connected in series with a capacitor between output terminal 13 and either of the terminals 14 and 15, permitting a single operating supply in place of the serially-connected operating supplies 16 and 17.

Transistors 11 and 12 have substantially equal common-emitter forward current gains, or $h_{fe}$'s. A constant current source 20 provides a substantially fixed current, $I_{20}$, which is equal to the maximum output current to be delivered via output terminal 13, divided by the $h_{fe}$ of the output transistor 11 or 12.

The base-emitter junction of transistor 11 is parallelled with a non-linear resistive network 30 shown as comprising a diode 31 and a linear resistive element 32. Diode 31 and the base-emitter junction of transistor 11 are maintained at substantially equal temperatures by means of a bilateral thermal coupling 33 between them. In the amplifier configuration shown in U.S. Pat. No. 3,855,540 the base-emitter junction of transistor 12 is parallelled with a similar non-linear resistive network comprising a diode and a linear resistive element in series connection, and the variable conduction device 23 responds to the input signal and bias source 25 to govern the division of a current $I_{20}$ from constant current source 20 as between these two parallel circuits. (The diodes 31 and 41 of the prior art amplifier configuration may in fact be self-biased NPN transistors, with their respective collector electrodes respectively connected to terminals 21 and 22, their respective base electrodes respectively connected to terminals 21 and 22 and their respective emitter electrodes respectively connected to the end of resistor 32 remote from terminal 13 and to the end of resistor 42 remote from terminal 15.) Current source 20 constrains the maximum current available to the base electrodes of transistor 11 and 12 to afford them over-current protection.

The FIGURE 1 amplifier configuration differs from the prior art amplifier configuration in that while the non-linear resistive network comprises, in series connection, the base-emitter junction of a transistor 41 and a linear resistive element 42, the collector electrode of transistor 41 connects to terminal 21, rather than to the terminal 22. Transistors 12 and 41 have bilateral thermal coupling between them so that their respective base-emitter junctions operate at substantially the same temperature.

With the connection of the collector electrode of transistor 41 to terminal 22, operation would be according to the prior art, with the current gain of transistor 12 being degenerated by the low-impedance presented in parallel to its base-emitter junction by the series connection of then self-biased transistor 41 and resistor 42. By connecting the collector of transistor 41 to a point where it does not couple signal directly back to its base electrode, the impedance presented by the base-emitter junction of transistor 41 and by resistor 42 is increased by the common-emitter forward current gain ($h_{fe}$) of transistor 41. The higher impedance shunting its base-emitter junction in effect increases the apparent current gain of transistor 12 by a factor $h_{fe}$.

By connecting the collector electrode of transistor 41 to terminal 21, its common-emitter forward current gain ($h_{fe}$) causes it to present a collector current variation to terminal 21 that is $h_{fe}$ times as large as the current flowing through variable conduction device 23. This increases the current gain through that portion of the amplifier including transistor 11 by the same factor, $h_{fe}$, that the current gain through that portion of the amplifier including transistor 12 is increased by the connection of the collector electrode of transistor 41 rather than to terminal 22. So, a symmetrical increase of current gain by a factor of $h_{fe}$ is obtained for output signal swings of either sense.

Connection of the collector electrode of transistor 41 to terminal 21 still arranges it to appear as a self-biased transistor insofar as the constant current supply 20 is concerned, in governing the amount of output current available to drive transistor 12, should load 18 be short-circuited.

At low current levels, the composite configuration comprising elements 11, 31 and 32 behaves like a current mirror amplifier having a current gain defined by the transconductance of transistor 11 divided by the conductance of diode 31 (i.e., the transconductance of the self-biased transistor forming diode 31, where diode 31 is a self-biased transistor). At low current levels, the composite configuration comprising elements 12, 41, 42 and 23 also behaves like a current mirror amplifier having a current gain defined by the transconductance of transistor 12 divided by that of transistor 41. Under quiescent conditions, $I_{20}$ is apportioned between these composite configurations in inverse ratio to their low-current current gains, owing to the overall feedback connection 26 (between output terminal 13 and input and bias signal source 25) adjusting the amplifier configuration 10 to cause substantially equal idling currents through output transistors 11 and 12. More specifically, FIG. 2 shows a Class AB amplifier 100, which is shown constructed substantially within the confines of a monolithic semiconductor integrated circuit represented by dashed outline. In amplifier 100, the variable conduction device 23 comprises a transistor 23' of a conductivity type the same as that of the output transistors 11 and 12.

Included within the circuit 100 is a biasing network 110 of the type described in detail in U.S. Pat. No. 3,885,541, issued Dec. 17, 1974 to A.J. Leidich and entitled "Current Proportioning Circuit." A current $I_0$ is withdrawn from the joined emitter electrodes of transistors 111 and 112. The potential appearing at the joined emitter electrodes of transistors 111 and 112 is equal to the offset potential across a forward-biased semiconductor junction (that is, $V_{BE} = 0.65$ volts, approximately, for a silicon junction with 1-0-0 crystal axis orientation.). This results because of the biasing afforded by the forward-biased diode-connected transistors 113, 114, 115 and 116 to the base electrodes of transistors 111 and 112. $I_0$ can be simply calculated according to Ohm's Law, as follows:

$$I_0 = \frac{V_{BE}}{R_{117} + R_{EXT}} \quad (1)$$

where $R_{117}$ is the resistance of resistor 117 and $R_{EXT}$ is the resistance of any resistive element connected between terminal 118 and ground. (No such external resistive element is shown in FIG. 2.) The biasing applied to the base electrodes of transistors 111 and 112 is such that the current $I_0$ flows substantially in the proportions $I_0 h_{feNPN}/(h_{feNPN} + 1)$ and $I_0/(h_{feNPN} + 1)$, respectively, through the collector-to-emitter paths of transistors 111 and 112, respectively, as explained in U.S. Pat. No. 3,855,541.

The collector current of transistor 111 is applied to the serial connection of diode-connected transistor 119 and resistor 120 to develop a potential which is applied to the base electrodes of transistors 121 and 122. Transistors 121 and 122 are similar in operating characteristics to transistor 119, and their respective emitter degeneration resistors 123 and 124 have the same resistance as resistor 120. The collector currents of transistors 119, 121 and 122 are substantially similar because of the similarity of their base-emitter circuits and their bias conditions. The collector current of transistor 119 is substantially equal to the $I_0 h_{feNPN}/(h_{feNPN} + 1)$ collector current demanded by transistor 111, so the collector currents of transistors 121 and 122 are substantially equal to $I_0 h_{feNPN}/(h_{feNPN} + 1)$. The collector current of transistor 121 is used to apply forward-bias current to the base-emitter junctions of transistors 111–116. A self-biased field-effect transistor 126 is used to initiate conduction in diode-connected transistor 119 and resistor 122. This provides the initial forward-base bias to transistor 121 required for its collector current to begin to flow and provide biasing to transistors 111–116. The collector current of transistor 122 corresponds to $I_{20}$, the quiescent bias current proportioned between the base electrodes of transistors 11 and 12 in amounts depending upon the conductance of the collector-to-emitter path of transistor 23'.

The collector current of transistor 112 is applied to diode-connected transistor 125 to develop a potential which is applied to the base electrode of a dual collector transistor 127. Transistor 127 responds with the collector currents from each of its collector electrodes which are proportional to the collector current of transistor 125, which is substantially equal to the $I_0/(h_{fe} + 1)$ collector current demanded by transistor 112.

A first collector current is supplied by dual-collector transistor 127 via connection 128 to a differential amplifier 130. This current supplies the combined emitter currents of emitter-coupled dual-collector transistors 131 and 132. Input signal terminals 133 and 134 of the differential amplifier 130 are coupled to the base electrodes of its transistors 131 and 132, respectively, via its common-collector amplifier transistors 135 and 136, respectively. One of the collector electrodes of each of the transistors 131 and 132 is connected to its own base electrode. This completes a degenerative feedback loop which lowers the input impedance of the transistor (131 or 132) and reduces the effect the collector-to-base capacitance of the transistor would otherwise have in reducing the bandwidth of differential amplifier stage. The other collector electrodes of transistors 131 and 132 are connected to the input and output circuits, respectively, of a current mirror amplifier 140, which forms an active load circuit with differential amplifier 130 to additively combine the collector current signal variations of transistors 131 and 132.

The current mirror amplifier 140 inverts the collector current variations of transistor 131, which are applied to it, to provide current variations to be additively combined with the collector current variations of transistor 132 at the base electrode of common-collector amplifier transistor 141. The current mirror amplifier 140 is of a type described in U.S. Pat. No. 3,873,955 issued Mar. 25, 1975 to Carl Franklin Wheatley, Jr., and entitled "Circuit With Adjustable Gain Current Mirror Amplifier." A potentiometer 143 connected between terminals 144 and 145 can be adjusted to vary the quiescent current level provided by differential amplifier 130 to the base electrode of transistor 141.

For equal bias potentials applied to terminals 133 and 134 and no signal potential between those terminals, potentiometer 143 is adjusted so sufficient base current is applied to transistor 141 to cause the following quiesecnt operating condition. The emitter current of transistor 141, which is an amplified version of its base current, is applied as base current to a following common-collector transistor 146, which demands an emitter current which is a twice-amplified version of the base current supplied to transistor 141. The emitter current demand of transistor 146 from node 148 is adjusted to be somewhat smaller than the $I_0/(h_{feNPN}+1)$ collector current of transistor 127 supplied to node 148 via connection 147. The rest of the current supplied to node 148 is applied as base current to transistor 23' to place its collector-to-emitter path into a desired degree of conduction. That is, transistor 23' diverts a portion of the current $I_{20}$ from flowing to non-linear to non-linear resistive network 30' and transistor 11 and directs this portion of the current $I_{20}$ to non-linear resistive network 40 and transistor 12 instead. The proportioning of the collector current $I_{20}$ of transistor 122 between the combination 30', 11 and the combination 40, 12 is such that the quiescent current flow through terminal 13 is nulled. That is, the quiescent current flow in non-linear resistive network 30' plus the quiescent emitter current of transistor 11 is adjusted in response to the setting of potentiometer 143 to equal the quiescent collector current of transistor 12.

When the potential applied to input terminal 134 of differential amplifier 130, is more positive than that applied to its input terminal 133, the conduction of transistor 131 will be increased relative to that of transistor 132. The increased collector current of transistor 131 as inverted by the current mirror amplifier 140 will exceed the collector current of transistor 132 to an increased degree. Consequently, increased base current will be withdrawn from transistor 141. This will increase the emitter current of transistor 141 proportionately and withdraw increased base current from transistor 146. The increased base current withdrawn from transistor 146 will increase its emitter current demand proportionately, thereby diverting a larger fraction of the collector current of transistor 127. In other words, a greater portion of the current flowing to node 148 is applied as emitter current to transistor 146 and a smaller portion is applied as base current to transistor 23'. The collector-to-emitter path of transistor 23' will thus be rendered less conductive. This increases the proportion of current $I_{20}$ which flows as base current to transistor 11 as compared to the portion of $I_{20}$ which flows as base current to transistor 12. This increases the collector-to-emitter conductance of transistor 11 compared to that of transistor 12 and applies a positive current to load 18.

When the potential applied to input terminal 134 is less positive than that applied to input terminal 133, the conducton of transistor 131 will be decreased relative to that of transistor 132. The decreased collector current of transistor 131 as inverted by the current mirror amplifier 140 will still exceed the collector current of transistor 132, but to a decreased degree. Consequently, the base current withdrawn from transistor 141 will be decreased from the quiescent bias condition. The emitter current of transistor 141 which withdraws base current from transistor 146 will be decreased proportionately. The decreased base current withdrawn from transistor 146 will reduce its emitter current demand proportionately. A decreased fraction of the collector current of transistor 127 coupled to node 148, via connection 147, will flow to the emitter electrode of transistor 146. Therefore, a larger proportion of this transistor 127 collector current will be applied as base current to transistor 23'. The collector-to-emitter path of transistor 23' is accordingly made more conductive than for quiescent bias conditions. This increases the proportion of current $I_{20}$, which flows as base current to transistor 12 as compared to the portion of $I_{20}$ which flows as base current to transistor 11. The collector-to-emitter conductance of transistor 12 is increased relative to that of transistor 11, which withdraws current from load 18. (This withdrawal of current from load 18 may be viewed as the application of a negative current to load 18.)

A diode-connected transistor 151 is included in the coupling of the collector electrode of transistor 122 to the non-linear resistive network 30' and base electrode of transistor 11. This diode-connected transistor 151 permits transistor 12 to go into saturated conduction on extreme negative swings of the output signal potential appearing at terminal 13.

The intermediate amplifier circuitry comprising common-collector amplifier transistors 141, 146 and variable conduction device 23' includes a phase-compensation capacitor 152 coupling its output and input circuits. This greatly attenuates the gain of amplifier 100 for frequencies sufficiently high that the accumulated phase shift between its input terminal 133 and its output terminal 13 together with a phase reversal associated with signal inversion approaches a value of $2\pi$ radians. By introducing a dominant single-zero low-pass, time constant into the operational amplifier transfer characteristic to reduce the amplitude of the overall gain of the amplifier below unity for those frequencies, the stability of the complete operational amplifier against self-oscillation will be unconditional even when there is a direct feedback connection between terminals 13 and 133 rather than a resistive potential divider comprising resistors 153, 154 as shown in FIG. 2.

Resistor 149, which may be a pinch resistor, is included to provide a small direct potential drop required to secure adequate collector potential for the collector electrode of transistor 132 connected to the base electrode of transistor 141 when the base electrodes of transistors 131 and 132 are operated with a quiescent potential equal to that appearing at terminal 15.

FIG. 3 shows a Class AB operational amplifier 100' which is similar to amplifier 100, but in which the variable conduction device 23 comprises a transistor 23" of a conductivity type which is the opposite to that of output transistors 11 and 12. Amplifier 100' offers improved operation at higher operating temperatures when input terminals 133 and 134 are biased to the same quiescent potential as appears on terminal 15 (here shown as ground) rather than to a quiescent potential intermediate between those impressed upon terminals 14 and 15.

Differential amplifier 130 supplies signal current to the base electrode of grounded-emitter amplifier transistor 241. Grounded-emitter amplifier transistor 241 is provided an $I_0/(h_{feNPN} + 1)$ constant current source collector load via connection 242 from transistor 127. The collector signal current of transistor 241, which is an amplified version of its base current, is applied to the base electrode of a grounded-collector amplifier transistor 246 for further current amplification. A twice-amplified version of the signal current applied to the base electrode of transistor 141 appears at the emitter electrode of transistor 246 and is applied to the base electrode of transistor 23" to control the conduction of its collector-to-emitter path.

As was done with the FIG. 2 operational amplifier, the potentiometer 143 of the operational amplifier shown in FIG. 3 is adjusted to obtain the following quiescent condition. The quiescent input current supplied to the base electrode of transistor 241, when amplified by transistors 241 and 246 and applied to the base electrode of transistor 23", is adjusted to cause the collector-to-emitter path of transistor 23" to be partially conductive. More particularly, the partial conduction of this path is such that the relative conductances of transistors 11 and 12 are proportioned so that the quiescent potential appearing at terminal 13 is mid-way between the potentials appearing at terminals 14 and 15. This adjustment of the potentiometer 143 is made with terminals 133 and 134 being at substantially the same potential.

When the potential appearing on terminal 134 is more positive or less negative than that appearing on terminal 133, the base current delivered to transistor 241 will be reduced from its quiescent value. This will, in turn, reduce the base current supplied to transistors 246 and 23", and will cause a reduction in the conductance of the collector-to-emitter path of transistor 23". As noted previously, reduction of the conductance of the variable conduction device 23, 23' or 23" between terminals 21 and 22 causes transistor 11 to become substantially more conductive than transistor 12. This results in positive-ward swing in the output potential appearing at terminal 13.

When the potential applied to terminal 134 is less positive or more negative than that applied to terminal 133, the base current supplied to transistor 241 will be increased. This will, in turn, increase the base currents of both transistors 246 and 23" and result in increased conductance of the collector-to-emitter path of transistor 23". As noted previously, the increased conductance of the variable conduction device 23, 23' or 23" between terminals 21 and 22 causes transistor 12 to be more conductive than transistor 11 and results in the ouput potential appearing at terminal 13 swinging negativeward in value.

In amplifier 100', the gain of differential amplifier 130 varies in inverse proportion with $h_{feNPN}'$ and provides offsetting compensation for changes in the gain of the grounded emitter transistor 241, $h_{feNPN}$. This permits phase-compensation capacitor 152 to be made smaller in capacitance and the bandwidth of the integrated operational amplifier 100' to be increased.

What is claimed is:

1. An amplifier comprising:
   an interconnection point adapted for coupling to a load circuit;
   first, second and third bipolar transistors of a first conductivity type, each having base and emitter electrodes with a base-emitter junction therebetween and having a collector electrode, the emitter electrode of said first transistor and the collector electrode of said second transistor being connected to said interconnection point, the collector and base electrodes of said third transistor being respectively connected to the base electrode of said first transistor and to the base electrode of said second transistor;
   means for applying an operating voltage between the emitter electrode of said second transistor and the collector electrode of said first transistor;
   a source of substantially constant quiescent biasing current;
   a variable conduction device with a variable conduction path between first and second electrodes thereof and with a control electrode, the conductance of said conduction path varying in response to a control signal applied to said control electrode, said first electrode of said device being connected to said source of substantially constant quiescent biasing current and being direct coupled to the base electrode of said first transistor and said second electrode of said device being direct coupled to the base electrode of said second transistor;
   first and second linear resistive elements, said first linear resistive element being connected between the emitter electrodes of said second and said third transistors; and
   a semiconductor junction connected in series with said second linear resistive element between the base and emitter electrodes of said first transistor with said junction poled for simultaneous conduction with the base-emitter junction of said first transistor.

2. An amplifier as set forth in claim 1 wherein said source of biasing current includes means for constraining the magnitude of said biasing current to a particular value, said value chosen such that the base currents available to said first and second transistors by apportioning said biasing current support sufficiently limited current flow through either of said first and said second transistors such that, even when substantially all of said operating potential appears across its principal conduction path, there will not be sufficient internal heating of the transistor to lead to its being seriously and permanently damaged.

3. An amplifier as set forth in claim 1 wherein said semiconductor junction is the base-emitter junction of a fourth, self-biased transistor of said first conductivity type.

4. An amplifier as set forth in claim 1 wherein said variable conduction device is a fourth transistor of said first conductivity type with collector and emitter and base electrodes corresponding respectively to its first and second and control electrodes.

5. An amplifier as set forth in claim 1 wherein said variable conduction device is a fourth transistor of a second conductivity type complementary to said first conductivity type, said fourth transistor having emitter and collector and base electrodes corresponding respectively to its first and second and control electrodes.

* * * * *